United States Patent
Quayle

(10) Patent No.: US 9,063,831 B1
(45) Date of Patent: Jun. 23, 2015

(54) METHOD AND APPARATUS FOR OPTIMIZING ACCESS TO CONTROL REGISTERS IN AN EMULATION CHIP

(71) Applicant: Cadence Design Systems, Inc., San Jose, CA (US)

(72) Inventor: Barton L. Quayle, San Jose, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 299 days.

(21) Appl. No.: 13/724,318

(22) Filed: Dec. 21, 2012

(51) Int. Cl.
*G06F 12/02* (2006.01)
*G06F 12/00* (2006.01)
*G06F 17/50* (2006.01)
*G06F 11/26* (2006.01)

(52) U.S. Cl.
CPC ............. *G06F 12/00* (2013.01); *G06F 11/261* (2013.01); *G06F 17/5027* (2013.01); *G06F 12/02* (2013.01)

(58) Field of Classification Search
CPC ..... G06F 12/00; G06F 12/02; G06F 17/5022; G06F 17/5027; G06F 11/261; G06F 11/263
See application file for complete search history.

(56) References Cited

U.S. PATENT DOCUMENTS

| | | | | |
|---|---|---|---|---|
| 4,425,643 A * | 1/1984 | Chapman et al. | ............. | 714/724 |
| 4,654,848 A * | 3/1987 | Noguchi | ........................ | 714/724 |
| 5,260,697 A * | 11/1993 | Barrett et al. | ................. | 345/173 |
| 5,287,503 A * | 2/1994 | Narad | ........................... | 710/220 |
| 5,790,888 A * | 8/1998 | Dreyer et al. | ................. | 711/167 |
| 5,926,580 A * | 7/1999 | McCoy | ......................... | 382/279 |
| 7,174,405 B1 * | 2/2007 | Dumov et al. | ................. | 711/100 |
| 8,549,251 B1 * | 10/2013 | Vemula et al. | ................. | 711/173 |
| 2004/0260530 A1 * | 12/2004 | Josso et al. | ....................... | 703/23 |
| 2005/0114113 A1 * | 5/2005 | Quayle et al. | ................... | 703/25 |
| 2008/0250365 A1 * | 10/2008 | Chou et al. | ......................... | 716/5 |
| 2011/0231587 A1 * | 9/2011 | Andersson et al. | ........... | 711/155 |

* cited by examiner

*Primary Examiner* — Michael Krofcheck
(74) *Attorney, Agent, or Firm* — Kaye Scholer LLP

(57) ABSTRACT

The present patent document relates to a method and apparatus for optimizing access to control registers in an emulation chip. Control messages include in one half of the message a write-mask bits for the corresponding control bits in the other half of the word. A single message from the host workstation can be used to update several bits of the register using a single message, rather than reading, modifying, then writing back each bit individually. Only the bits desired to be updated are written, while the masked bits are not affected. Various configurations of the mask bits and control bits are possible, and block transfers can be used to update bits across a series of registers. The disclosed method and apparatus can reduce overhead and latency on communication channels to the host workstation by significantly reducing the number of individual transfer across the channel.

18 Claims, 4 Drawing Sheets

METHOD AND APPARATUS FOR OPTIMIZING ACCESS TO CONTROL REGISTERS IN AN EMULATION CHIP

FIELD

The present patent document relates generally to processor-based hardware functional verification systems. In particular, the present patent document relates to a method and apparatus for optimizing access to control registers in an emulation chip.

BACKGROUND

Hardware functional verification systems ("emulators") are programmable devices used to verify hardware designs and integrated circuits having very high logic densities, and large numbers of logic gates. A common method of design verification is to use processor-based hardware emulators to emulate the design prior to physically manufacturing the integrated circuit of the hardware. These processor-based emulators sequentially evaluate combinatorial logic levels in the design under verification, starting at the inputs and proceeding to the outputs. Each pass through the entire set of logic levels is known as a cycle; the evaluation of each individual logic level is known as an emulation step.

Hardware emulators allow engineers and hardware designers to test and verify the operation of an integrated circuit, an entire board of integrated circuits, or an entire system without having to first physically fabricate the hardware. The complexity and number of logic gates present on an integrated circuit increases significantly every year. In order to emulate such large, high-gate-count, integrated circuits, processor-based hardware emulators now commonly contain dozens or hundreds of logic emulation chips, each emulation chip containing hundreds or thousands of processors. The term "emulation chip" is used broadly to include both monolithic integrated circuits as well as multi-chip packages. These emulation chips themselves are generally ASICs, designed or configured specifically for emulation.

As emulation systems continue to grow in size and complexity, the bandwidth requirements of the controlling interface connected to a host workstation grow as well. Controlling software running on the host workstation manages emulator resources and various user processes accessing those resources. Program access to configure and control the emulation chips is achieved through the use of many control registers in the emulation chips. The various bit positions in those registers determine the state, function, configuration, and operation of parts of the emulation chip, the whole emulation chip, or the entire system. An emulation chip may have as many as four thousand ninety-six, each having sixteen control registers, for a total of sixty-four thousand control registers per emulation chip. Since there may be dozens or hundreds of emulation chips, the number of control registers can be more than a million. As bandwidth requirements of the communication channels to the emulation chips increase, the general size of transfers across the channels also increases.

One common method for changing individual bits in a register is to read the register to determine its present state, and write an updated value back to the register, changing only the desired bits while leaving other bits in their previous state. On a communication channel with high-latency, this read-modify-write method of register access requires significant time on the communications channel, using already scarce communication channel resources.

Another common method for changing individual bits in a register involves keeping shadow copy of the registers in the local memory on the host workstation, for instance in RAM. As the central software of the host workstation updates registers via the communication channel, it also updates its local shadow copy. This eliminates some of the multiple transactions across the communication channel, decreasing latency and communication channel usage. However, this requires a local copy of all registers, which can be a significant memory usage. In additional, if a register is accessed by multiple processes or multiple processors, multiple copies of the register may be required, resulting in coherency problems similar to cache coherency problems among various copies.

SUMMARY

A method and apparatus for optimizing access to control registers in an emulation chip is disclosed. According to an embodiment, a method of updating registers of a plurality of hardware resources in an emulation system comprises receiving a message at a communication interface, the message addressed to a register set of a hardware resource of the emulation system and carrying a word that includes a plurality of mask bits and a plurality of new control bits; reading a plurality of old control bits from a plurality of control registers of the register set; operating on the plurality of old control bits with the plurality of mask bits and the plurality of new control bits to generate a plurality of updated control bits; and writing the plurality of updated control bits to the plurality of control registers of the register set.

In another embodiment the new control bits comprise one or more configuration bits and one or more trigger bits, wherein each configuration bit of the one or more configuration bits is written to the plurality of control registers prior to when any trigger bit of the one or more trigger bits are written to the plurality of control registers during writing the plurality of updated control bits to the plurality of control registers of the register set.

In another embodiment the plurality of control bits occupy a lower bit portion of the word and the plurality of mask bits occupy a higher bit portion of the word.

In another embodiment each mask bit of the plurality of mask bits and each control bit of the plurality of control bits has a bit position in the word, and wherein the bit position of each mask bit alternates with the position of each control bit.

In another embodiment the word comprises sixty-four bits comprising thirty-two control bits and thirty-two mask bits.

According to an embodiment, a computer-readable non-transitory storage medium having stored thereon a plurality of instructions is disclosed. The plurality of instructions when executed by a computer, cause the computer to perform receiving a message at a communication interface, the message addressed to a register set of a hardware resource of the emulation system and carrying a word that includes a plurality of mask bits and a plurality of new control bits; reading a plurality of old control bits from a plurality of control registers of the register set; operating on the plurality of old control bits with the plurality of mask bits and the plurality of new control bits to generate a plurality of updated control bits; and writing the plurality of updated control bits to the plurality of control registers of the register set.

In another embodiment the new control bits comprise one or more configuration bits and one or more trigger bits, wherein each configuration bit of the one or more configuration bits is written to the plurality of control registers prior to when any trigger bit of the one or more trigger bits are written to the plurality of control registers during writing the plurality of updated control bits to the plurality of control registers of the register set.

In another embodiment the plurality of control bits occupy a lower bit portion of the word and the plurality of mask bits occupy a higher bit portion of the word.

In another embodiment each mask bit of the plurality of mask bits and each control bit of the plurality of control bits has a bit position in the word, and wherein the bit position of each mask bit alternates with the bit position of each control bit.

In another embodiment the word comprises sixty-four bits comprising thirty-two control bits and thirty-two mask bits.

According to an embodiment, a hardware functional verification system including a plurality of emulation resources comprises a communication channel configured to connect to a host workstation and configured to carry a control message addressed to a register set of a plurality of register sets, wherein the control message contains a plurality of new control bits and a plurality of mask bits; and a plurality of emulation chips coupled to the communication channel, each emulation chip comprising: a plurality of processors; the plurality of register sets, wherein each register set is configured to store a plurality of old control bits for an emulation resource of the emulation chip, and wherein each register set has a plurality of input ports and a plurality of output ports; and a masking circuit, in electrical communication with the plurality of input ports and the plurality of output ports, to perform a mask operation using the plurality of new control bits, the mask bits, and the plurality of old control bits.

In another embodiment, the hardware functional verification system further comprises an enable circuit for each register set of the plurality of register sets.

In another embodiment, the masking circuit comprises a set of multiplexers and a state machine.

In another embodiment, the new control bits contain one or more configuration bits and one or more trigger bits, and wherein the masking circuit is configured to write each configuration bit of the one or more configuration bits to the plurality of control registers prior to when any trigger bit of the one or more trigger bits are written to the plurality of control registers.

In another embodiment, the plurality of new control bits occupy a lower bit portion of the control message and the plurality of mask bits occupy a higher bit portion of the control message.

In another embodiment, each mask bit of the plurality of mask bits and each new control bit of the plurality of new control bits has a bit position in the control message, and wherein the bit position of each mask bit alternates with the bit position of each control bit.

In another embodiment, each control message comprises thirty-two control bits and thirty-two mask bits.

According to another embodiment a hardware functional verification system including a plurality of emulation chips disposed on a circuit board, each emulation chip having a plurality of processors, a masking circuit, and a plurality of register sets; and a communications channel configured to carry messages between a host workstation and the plurality of emulation chips, wherein each emulation chip is configured to: receive a message addressed to a register set of the plurality of register sets, wherein the message carries a word that includes a plurality of mask bits and a plurality of new control bits; read a plurality of old control bits from a plurality of control registers of the register set; operate on the plurality of old control bits with the plurality of mask bits and the plurality of new control bits to generate a plurality of updated data bits; and write the plurality of updated control bits to the plurality of control registers of the register set.

In another embodiment, the new control bits comprise one or more configuration bits and one or more trigger bits, wherein each configuration bit of the one or more configuration bits is written to the plurality of control registers prior to when any trigger bit of the one or more trigger bits are written to the plurality of control registers during writing the plurality of updated control bits to the plurality of control registers of the register set.

In another embodiment, the plurality of control bits occupy a lower bit portion of the word and the plurality of mask bits occupy a higher bit portion of the word.

In another embodiment, each mask bit of the plurality of mask bits and each control bit of the plurality of control bits has a bit position in the word, and wherein the bit position of each mask bit alternates with the position of each control bit.

In another embodiment, the word comprises sixty-four bits comprising thirty-two control bits and thirty-two mask bits.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
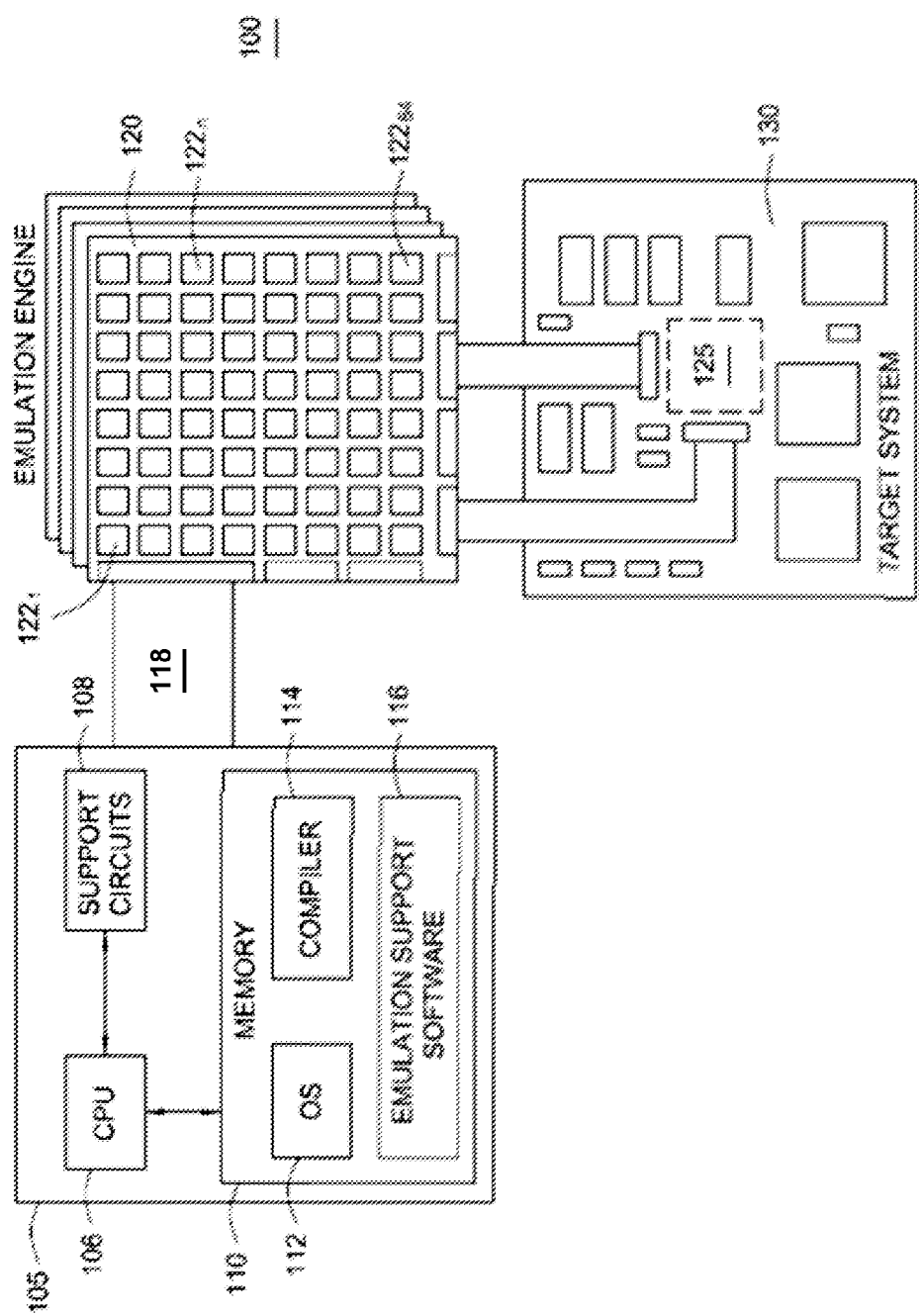
FIG. 1 is an illustration of a processor-based hardware emulation system.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for optimizing access to control registers in an emulation chip is disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 depicts an overview of an emulation system 100, according to an embodiment. The system comprises a host computer workstation 105, an emulation engine including emulation board 120, and a target system 130.

The host workstation 105 provides emulation support facilities to the emulation engine and emulation board 120. The computer workstation 105, for example a personal computer, comprises at least one central processing unit (CPU) 106, support circuits 108, and a memory 110. The CPU 106 may comprise one or more conventionally available microprocessors and/or microcontrollers. The support circuits 108 are well known circuits that are used to support the operation of the CPU 106. These supporting circuits comprise power supplies, clocks, input/output interface circuitry, cache, and other similar circuits.

Memory 110, sometimes referred to as main memory, may comprise random access memory, read only memory, disk memory, flash memory, optical storage, and/or various combinations of these types of memory. Memory 110 may in part be used as cache memory or buffer memory. Memory 110 stores various forms of software and files for the emulation system, such as an operating system (OS) 112, a compiler 114, and emulation support software 116. The compiler 114 converts a hardware design, such as hardware described in VHDL or Verilog, to a sequence of instructions that can be evaluated by the emulation board 120.

The host workstation 105 allows a user to interface with the emulation engine via communications channels 118, including emulation board 120, and configure and control the emulation process and collect emulation results for analysis. The host workstation 105 runs software that configures and manages the allocation of emulation resources. Under control of the host workstation 105, programming information and data is loaded to the emulation engine 100. The emulation board 120 has on it a number of individual emulation chips, for example the sixty-four emulation chips $122_1$ to $122_{64}$ (collectively 122), in addition to miscellaneous support circuitry. The term "emulation chip" is used broadly to include both monolithic integrated circuits as well as multi-chip packages.

In response to programming received from the emulation support software 116, emulation engine emulates a portion 125 of the target system 130. Portion 125 of the target system 130 may be an integrated circuit, a memory, a processor, or any other object or device that may be emulated in a programming language. Exemplary emulation programming languages include Verilog and VHDL.

Figure 2:
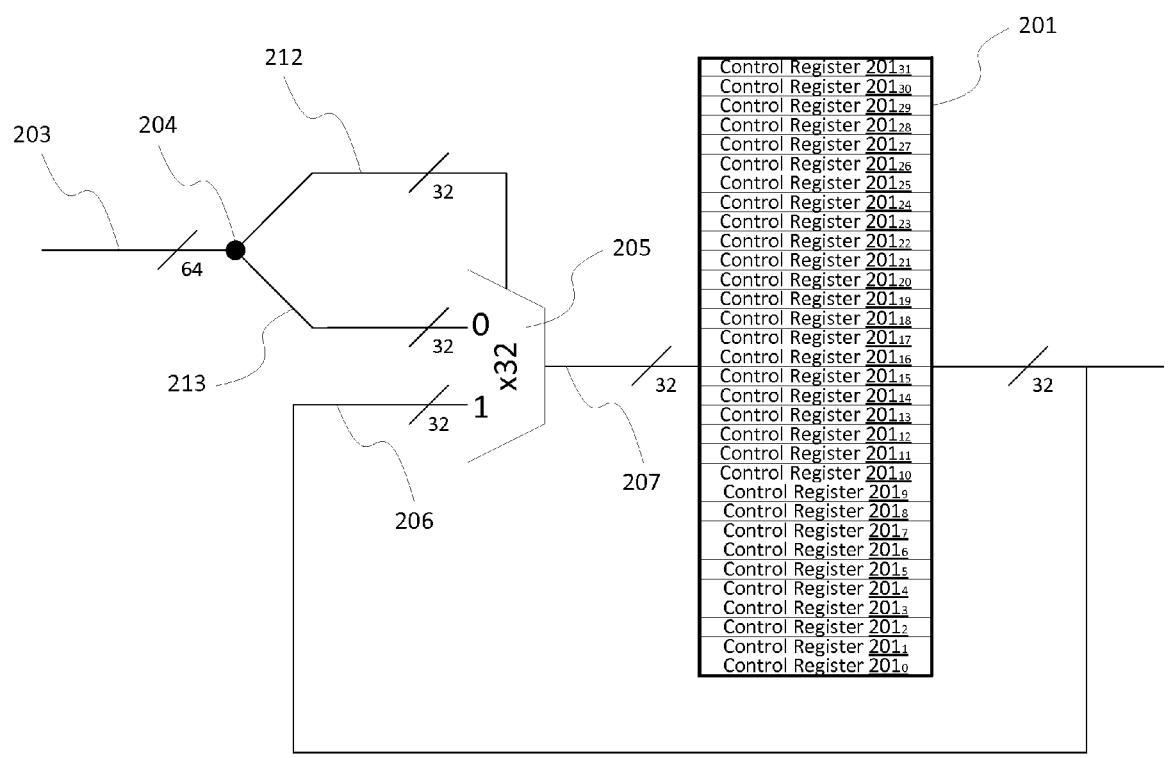
FIG. 2 is an illustration of a set of registers for a component of an emulation chip of a processor-based hardware functional verification systems having a masking circuit for thirty-two control registers.

Access to configure and control the emulation chips 122 from the host workstation 105 is achieved through the use of many control registers in the emulation chips. For example, each processor of the emulation chip has its own set of registers. The various bit positions in those registers determine the state, function, configuration, and operation of parts of the emulation chip, the whole emulation chip, and the entire system. In order to update a register associated with a particular processor of an emulation chip, the host workstation sends one or more messages over the communication interface 118 addressed to the register. A portion of each of the one or more messages contains the register bits to be updated while another portion of the message contains mask bits. Block transfers can be used to update several bits distributed across a series of registers without having to read any individual registers or even affect some of the registers. This adds to the message size, but eliminates the need to read the registers back to the host workstation FIG. 2 illustrates a set of registers 201 for a component of an emulation chip according to an embodiment. The communication channel to the emulator is based on sixty-four bit words, for example a sixty-four bit PCIe channel. The various processors of the emulation chip each have such a set of registers 201. The component of the emulation chip could also be any other circuit of the emulation chip that use registers, for example a DMA controller. The bit-maskable registers are created with thirty-two bit contents $201_0$ to $201_{31}$. Interconnect 203 carries a sixty-four bit word having thirty-two mask bits in the first half of the word and thirty-two control bits in the second half of the word that have already been unpacked from the message carried over the communication channel from the host workstation. The control bits can be separated from the mask bits using a simple switch or splitter 204. Masking circuit 205 reads the registers, modifies the contents in accordance with the received mask bits and control bits, and then writes the contents back to the registers. The contents of registers 201 are read by masking circuit 205 via interconnect 206. Masking circuit 205 writes to the registers 201 via interconnect 207. Masking circuit 205 can include, for example, a set of thirty-two two-input muxes where the contents of register set 201 are one set of inputs and the incoming control bits on bus 213 are the second set of inputs, where the mask bits on bus 212 select the inputs to output to register set 201. The implementation of masking circuit 205 can also include a state machine to mask individual registers, as well as other miscellaneous support circuits.

Consider a control register 201 having only seven usable bits. In such case, only seven mask bits would be needed. If the seven bits 0-3, 8-9, and 24 are in control register positions $201_0$ to $201_3$, $201_8$ to $201_9$, and $201_{24}$, where the 0 bit in position $201_0$ is the least significant bit, then the mask bits would be positioned thirty-two bits above the control bits at bit positions 32-35, 40-41, and 56 in the sixty-four bit word. Those registers that might not need a bit-mask, for example an address field, can be implemented with mask bits so that an entire array of registers can be implemented without changing that particular address. Multiple registers can be updated with a single block transfer with a word on the communication channel, even if only some of the registers are to be updated. A masking circuit 205 receives the sixty-four bits after the bits have been unpacked from the message carried from the host workstation. Where the registers share a common enable circuit receiving an enable signal to enable the whole register set 201, the masking circuit 205 can read each register, modify it or not according to the mask bits and control bits, and write the result back to the register.

Where control bits including configuration bits and bits triggering operations in the processor are transferred in the same block transfer, a mechanism is needed to prevent the triggering bits from triggering an operation before each of the configuration bits can be written to the registers, potentially leading to errors. The registers can be configured such that each bit of register 201 only takes effect after the block transfer is complete and all the bits are written to the registers. Alternatively, the registers can be arranged such that the configuration bits are written prior to the triggering bits, so that the configuration bits are in place before any operations are triggered.

According to an embodiment, a DMA controller uses sixty-four bit registers for control. The lower thirty-two bits contain the contents and the upper thirty-two bits contain the mask bits. The source address register (0x00), the destination address register (0x08), transfer length register (0x10), and the priority register (0x18) would be updated before the control register (0x48) where the start bit is written. Here, the linked address register (0x20) and the process ID register (0x28) would be a left unchanged by setting the upper bitmask to 0xFFFF_FFFF_0000_0000, indicating that all of the lower thirty-two bits should not be updated. Three transfer status registers (0x30, 0x38, and 0x40) could be masked or ignored as they are "read-only." The control register would only have the lower two bytes updated, leaving the other configuration bits in their original settings. The word written can be 0xFFFF_FF06_0000_0079, setting bit 7 to zero, and bits 0, 3, and 4-6 to one, leaving bits 1-2 and 8-31 unwritten. TABLE 1 below contains exemplary register addresses and contents, together with example fill values, including mask bits:

TABLE 1

| Address | Contents | Example Write Value |
|---------|----------|---------------------|
| 0x00 | 32-bit Source Address | 0x0000_0000_0000_AAA0 |
| 0x08 | 32-bit Destination Address | 0x0000_0000_0000_BBB0 |
| 0x10 | 32-bit Transfer Length | 0x0000_0000_0002_0000 |
| 0x18 | 32-bit Priority: bit 0-3 priority value, bit 4-31 unused | 0xFFFF_FFFF_0000_0000 |
| 0x20 | 32-bit Linked Address | 0xFFFF_FFFF_0000_0000 |
| 0x28 | 32-bit Process ID | 0xFFFF_FFFF_0000_0000 |
| 0x30 | 32-bit Transfer Status A (ro) | 0x0000_0000_0000_0000 |
| 0x38 | 32-bit Transfer Status B (ro) | 0x0000_0000_0000_0000 |
| 0x40 | 32-bit Transfer Status C (ro) | 0x0000_0000_0000_0000 |
| 0x48 | 32-bit Command: 0 - start xfer; 1 - reset i/f; 2 - linked; 3 - single xfer; 4-6 - burst size; 7 - test mode | 0xFFFF_FF06_0000_0079 |

Another embodiment has alternating, or interleaved, control bits and mask bits in a sixty-four bit word. In such arrangement mask bit at bit position 0 is followed by control bit at bit position 1, which is followed by a second mask bit at bit position 2, which is followed by a second control bit at bit position 3, and so on all the way to control bit 32 at bit position 63. This even-odd configuration allows for easier assembly of the mask bits and control bits, which can be handled by appropriately-configured masking circuit, including, for example, a two-input mux 205 where the contents of register set 201 are one set of inputs on bus 206 and the incoming control bits on bus 213 are the second set of inputs, where the mask bits on bus 212 select the inputs 213 or 206 to output to register set 301. The even-odd configuration primarily provides benefits for larger register sets, where each control bit would be relatively far from its corresponding mask bit in the configuration that reserves the upper half of the word for mask bits and the lower half of the word for control bits. Registers larger than about thirty-two bits primarily benefit from such an arrangement.

In an alternative embodiment, the word may also alternate mask bits and control bits starting with the control bit, followed by its corresponding mask bit. A control bit at bit position 0 is followed by mask bit at bit position 1, which is followed by a second control bit at bit position 2, which is followed by a second mask bit at bit position 3, and so on to the end of the word with a mask bit at bit position 63. Masking circuit 205 can be configured somewhat differently take account of the switched position of the control and mask bits.

Figure 3:
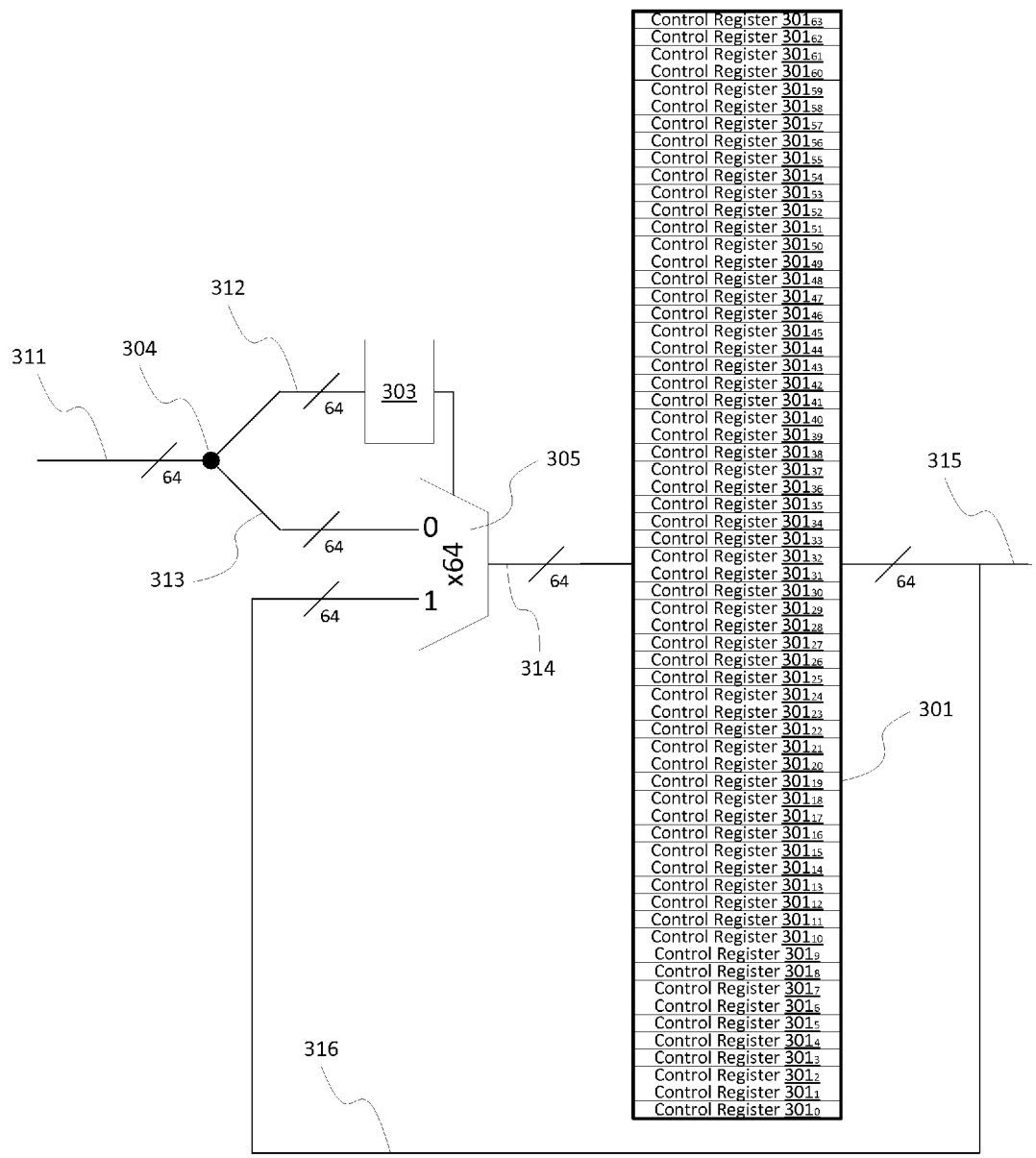
FIG. 3 is an illustration of a set registers for a component of an emulation chip having a masking circuit for sixty-four control registers.

FIG. 3 illustrates a circuit wherein a sixty-four bit word is used to write to a sixty-four bit register. Because sixty-four control bits and sixty-four mask bits are needed, two words are used. The control bits can be separated from the mask bits using a simple switch or splitter 304. A FIFO or buffer is included to delay each mask bit and align the control bit with its corresponding mask bit. A sixty-four deep FIFO or buffer 303 can be used to delay sixty-four mask bits from a first word while awaiting the second word containing the sixty-four control bits. A set of two-input muxes then masks the contents of control register 301.

Figure 4:
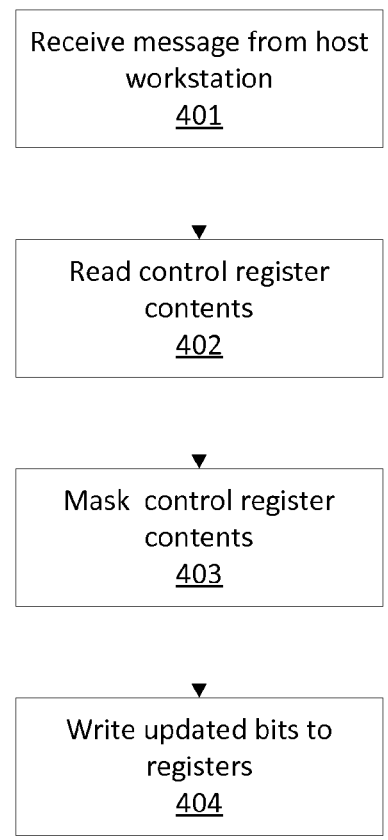
FIG. 4 illustrates a flow to update the contents of control registers using a write-mask.

FIG. 4 illustrates a flow to update the contents of control registers according to an embodiment. First, the host workstation sends a message addressed to a set of control registers of a particular emulation chip. This message can be in any suitable format used by the hardware functional verification system, with the message carrying a word having mask bits and control bits for the register set. For example, the message can be a PCIe packet with a sixty-four bit payload of thirty-two mask bits and thirty-two control bits. The emulation chip receives and unpacks the packet, revealing the payload at step 401. The contents of the control registers are then read at step 402 and operated on by the mask bits and control bits sent from the host workstation at step 403 using a masking circuit. The resulting bits of the operation are written back to the registers at step 404, where only certain of the register contents are modified, as specified by the mask bits sent from the host workstation.

The disclosed teachings have several advantages. In an emulation system where the communication channel from the workstation is optimized for block transfers, a block transfer can be used to update individual bits of several configuration registers. This eliminates the overhead of a variety of individual transfers and significantly reduces the latency of the entire operation. The number of bits transferred increases because of the presence of the mask. However, the bits can be sent in a single, larger packet, without the requirement that the control registers be read back to the host workstation. While the read-modify-write procedure for individual bits results in fewer bits being transferred, it requires an increased total number of packets to modify more than a single register.

Sending the mask and control bits in a single packet is most advantageous for reducing communication channel overhead and latency where there are a large number of registers being updated. As an example, if three registers are to be updated, twelve packets are sent in the read-modify-write scheme, whereas a single longer packet is sent according to the disclosed embodiments. In such a case, the total bandwidth required can be about the same. However, the single larger data packet quickly reduces overhead and latency compared to a read-modify-write scheme if a greater number of registers are to be updated, for example sixteen registers, which require a large number of packets to traverse the communication interface in the read-modify-write scheme.

In addition the disclosed teachings avoid some issues of concurrent access, such as those experienced by systems that keep a copy of the register contents in local memory of the host workstation, where the registers are accessed by multiple processes or multiple processors.

Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A method of updating registers of a plurality of hardware resources in an emulation system comprising:
   receiving a message at a communication interface, the message addressed to a register set of a hardware resource of the emulation system and carrying a word that includes a plurality of mask bits and a plurality of new control bits;
   reading a plurality of old control bits from a plurality of control registers of the register set;
   operating on the plurality of old control bits with the plurality of mask bits and the plurality of new control bits to generate a plurality of updated control bits; and
   writing the plurality of updated control bits to the plurality of control registers of the register set, wherein the new control bits comprise one or more configuration bits and one or more trigger bits, wherein each configuration bit of the one or more configuration bits is written to the plurality of control registers prior to when any trigger bit of the one or more trigger bits are written to the plurality of control registers during writing the plurality of updated control bits to the plurality of control registers of the register set.

2. The method of claim 1, wherein the plurality of control bits occupy a lower bit portion of the word and the plurality of mask bits occupy a higher bit portion of the word.

3. The method of claim 1, wherein each mask bit of the plurality of mask bits and each control bit of the plurality of control bits has a bit position in the word, and wherein the bit position of each mask bit alternates with the position of each control bit.

4. The method of claim 1, wherein the word comprises sixty-four bits comprising thirty-two control bits and thirty-two mask bits.

5. A computer-readable non-transitory storage medium having stored thereon a plurality of instructions, the plurality of instructions when executed by a computer, cause the computer to perform:
   receiving a message at a communication interface, the message addressed to a register set of a hardware resource of the emulation system and carrying a word that includes a plurality of mask bits and a plurality of new control bits;
   reading a plurality of old control bits from a plurality of control registers of the register set;
   operating on the plurality of old control bits with the plurality of mask bits and the plurality of new control bits to generate a plurality of updated control bits; and
   writing the plurality of updated control bits to the plurality of control registers of the register set, wherein the new control bits comprise one or more configuration bits and one or more trigger bits, wherein each configuration bit of the one or more configuration bits is written to the plurality of control registers prior to when any trigger bit of the one or more trigger bits are written to the plurality of control registers during writing the plurality of updated control bits to the plurality of control registers of the register set.

6. A computer-readable non-transitory storage medium of claim 5, wherein the plurality of control bits occupy a lower bit portion of the word and the plurality of mask bits occupy a higher bit portion of the word.

7. A computer-readable non-transitory storage medium of claim 5, wherein each mask bit of the plurality of mask bits and each control bit of the plurality of control bits has a bit position in the word, and wherein the bit position of each mask bit alternates with the bit position of each control bit.

8. A computer-readable non-transitory storage medium of claim 5, wherein the word comprises sixty-four bits comprising thirty-two control bits and thirty-two mask bits.

9. A hardware functional verification system including a plurality of emulation resources, comprising:
 a communication channel configured to connect to a host workstation and configured to carry a control message addressed to a register set of a plurality of register sets, wherein the control message contains a plurality of new control bits and a plurality of mask bits; and
 a plurality of emulation chips coupled to the communication channel, each emulation chip comprising:
  a plurality of processors;
  the plurality of register sets, wherein each register set is configured to store a plurality of old control bits for an emulation resource of the emulation chip, and wherein each register set has a plurality of input ports and a plurality of output ports; and
  a masking circuit, in electrical communication with the plurality of input ports and the plurality of output ports, to perform a mask operation using the plurality of new control bits, the mask bits, and the plurality of old control bits,
 wherein the plurality of new control bits contain one or more configuration bits and one or more trigger bits, and wherein the masking circuit is configured to write each configuration bit of the one or more configuration bits to the plurality of control registers prior to when any trigger bit of the one or more trigger bits are written to the plurality of control registers.

10. The hardware functional verification system of claim 9, further comprising an enable circuit for each register set of the plurality of register sets.

11. The hardware functional verification system of claim 9, wherein the masking circuit comprises a set of multiplexers and a state machine.

12. The hardware functional verification system of claim 9, wherein the plurality of new control bits occupy a lower bit portion of the control message and the plurality of mask bits occupy a higher bit portion of the control message.

13. The hardware functional verification system of claim 9, wherein each mask bit of the plurality of mask bits and each new control bit of the plurality of new control bits has a bit position in the control message, and wherein the bit position of each mask bit alternates with the bit position of each control bit.

14. The hardware functional verification system of claim 9, wherein each control message comprises thirty-two control bits and thirty-two mask bits.

15. A hardware functional verification system including a plurality of emulation resources, comprising:
 a plurality of emulation chips disposed on a circuit board, each emulation chip having a plurality of processors, a masking circuit, and a plurality of register sets; and
 a communications channel configured to carry messages between a host workstation and the plurality of emulation chips,
 wherein each emulation chip is configured to:
  receive a message addressed to a register set of the plurality of register sets, wherein the message carries a word that includes a plurality of mask bits and a plurality of new control bits;
  read a plurality of old control bits from a plurality of control registers of the register set;
  operate on the plurality of old control bits with the plurality of mask bits and the plurality of new control bits to generate a plurality of updated data bits; and
  write the plurality of updated control bits to the plurality of control registers of the register set,
 wherein the new control bits comprise one or more configuration bits and one or more trigger bits, wherein each configuration bit of the one or more configuration bits is written to the plurality of control registers prior to when any trigger bit of the one or more trigger bits are written to the plurality of control registers during writing the plurality of updated control bits to the plurality of control registers of the register set.

16. The hardware functional verification system of claim 15, wherein the plurality of control bits occupy a lower bit portion of the word and the plurality of mask bits occupy a higher bit portion of the word.

17. The hardware functional verification system of claim 15, wherein each mask bit of the plurality of mask bits and each control bit of the plurality of control bits has a bit position in the word, and wherein the bit position of each mask bit alternates with the position of each control bit.

18. The hardware functional verification system of claim 15, wherein the word comprises sixty-four bits comprising thirty-two control bits and thirty-two mask bits.

* * * * *